United States Patent
Zhu et al.

(10) Patent No.: US 7,476,558 B2
(45) Date of Patent: Jan. 13, 2009

(54) METHOD FOR MANUFACTURING SELECTIVE AREA GROWN STACKED-LAYER ELECTRO-ABSORPTION MODULATED LASER STRUCTURE

(75) Inventors: Hongliang Zhu, Beijing (CN); Wei Wang, Beijing (CN)

(73) Assignee: Institute of Semiconductors, Chinese Academy of Sciences, Beijing (CN)

( * ) Notice: Subject to any disclaimer, the term of this patent is extended or adjusted under 35 U.S.C. 154(b) by 707 days.

(21) Appl. No.: 11/215,637

(22) Filed: Aug. 30, 2005

(65) Prior Publication Data

US 2006/0056755 A1 Mar. 16, 2006

(30) Foreign Application Priority Data

Sep. 16, 2004 (CN) ............ 2004 1 0778635
Jan. 18, 2005 (CN) ............ 2005 1 0045713

(51) Int. Cl.
*H01L 21/00* (2006.01)
(52) U.S. Cl. ............... 438/23; 438/29; 438/39; 438/47
(58) Field of Classification Search ............... 438/22, 438/23, 29, 32, 39, 41, 46, 47
See application file for complete search history.

(56) References Cited

U.S. PATENT DOCUMENTS

| | | | | | |
|---|---|---|---|---|---|
| 4,755,015 | A | * | 7/1988 | Uno et al. ............... | 385/131 |
| 5,459,747 | A | | 10/1995 | Takiguchi et al. | |
| 5,548,607 | A | | 8/1996 | Tsang | |
| 5,574,289 | A | * | 11/1996 | Aoki et al. ............... | 257/17 |
| 6,013,539 | A | * | 1/2000 | Kashima et al. ........... | 438/31 |
| 6,066,859 | A | * | 5/2000 | Stegmueller ............. | 257/21 |
| 6,148,017 | A | * | 11/2000 | Borchert et al. .......... | 372/50.1 |
| 6,973,226 | B2 | * | 12/2005 | Sato et al. ............... | 385/14 |
| 2001/0034071 | A1 | * | 10/2001 | Arakawa et al. .......... | 438/22 |
| 2005/0249509 | A1 | * | 11/2005 | Nagarajan et al. ........ | 398/198 |

FOREIGN PATENT DOCUMENTS

| | | |
|---|---|---|
| CN | 1114977 C | 7/2003 |
| CN | ZL00109780.6 | 7/2003 |

(Continued)

OTHER PUBLICATIONS

Xiaohua, Hu et al., Monolithic Integration of Electro-Absorption Modulators and DFB Lasers by Modified Double Stack Active Layer Approach, *Chinese Journal of Semi Conductors*, vol. 25, No. 5, May 2004.

(Continued)

*Primary Examiner*—Kevin M Picardat
(74) *Attorney, Agent, or Firm*—McDermott Will & Emery LLP

(57) ABSTRACT

This invention relates to a method for manufacturing selective area grown stacked-layer electro-absorption modulated laser structure, comprising: step 1: forming a selective growth pattern of a modulator section on a substrate; step 2: simultaneously growing a 2-stacked-layer active region structure of a modulator MQW layer and a laser MQW layer by the first epitaxy step; step 3: etching gratings, and removing the laser MQW layer in the modulator section by selective etching; and step 4: completing the growth of the entire electro-absorption modulated laser structure by a second epitaxy step.

11 Claims, 2 Drawing Sheets

FOREIGN PATENT DOCUMENTS

CN    1527447 A    9/2004
CN    200310122343.7    6/2005

OTHER PUBLICATIONS

Ramdane et al.; *Monolithic Integration of InGaAsP-InP Strained-Layer Distributred Feedback Laser and External Modulator by Selective Quantum-Well Interdiffusion*; IEEE Photonics Technology Letters, vol. 7, No. 9, Sep. 1995.

Stegmueller et al.; *15-GHz Modulation Performance of Integrated DFB Laser Diode EA Modulator With Identical Multiple-Quantum-Well Double-Stack Active Layer*; IEEE Photonics Technology Letters, vol. 14, No. 12, Dec. 2002.

\* cited by examiner

METHOD FOR MANUFACTURING SELECTIVE AREA GROWN STACKED-LAYER ELECTRO-ABSORPTION MODULATED LASER STRUCTURE

This application claims priority from Chinese Application No. 2004100778635, filed Sep. 16, 2004 (incorporated by reference Herein) and Chinese Application No. 2005100045713, filed Jan. 18, 2005 (incorporated by reference herein).

BACKGROUND OF THE INVENTION

1. Field of Invention

The present invention relates to semiconductor technologies, and more particularly, to a method for manufacturing a selective area grown (SAG) stacked-layer electro-absorption modulated distributed feedback lasers (EMLs) structure, which has the advantage of simple process and fabricates monolithically integrated EML of low threshold current.

2. Description of Prior Art

A monolithically integrated device of an electro-absorption modulator (EAM) and a distributed feedback (DFB) laser diode (LD), EML, is a significant transmitting light-source of optical communication systems, especially, in high speed long-haul trunks. At present, a main method for manufacturing the EML integrated light-sources is Butt-Joint method. For example, the international famous corporations such as NEC, Hitachi, AT&T, Lucent and France Telecom all adopt such method to develop EMLs. In such method, the EAM active layer and the LD active layer are respectively grown by two epitaxies (see U.S. Pat. No. 5,459,747), which facilitates the selection of structural parameters of both active layers, and EML devices thus manufactured are of better characteristics. However, the Butt-Joint method requires multiple epitaxial growths, complex manufacturing process and very high precision requirements of the process. Additionally, the joining interface of the active sections, that is the joining interface of the EAM active section and the LD active section, which are respectively grown by two epitaxies, usually leads to crystal quality problems such as holes or bumps, causing the low yield and high cost of EMLs.

In recent years, in order to reduce the cost and simplify the process, the basis of the work to develop EMLs focuses on a manufacturing method for growing the LD active layer and the EAM active layer simultaneously by a single epitaxy.

Following are manufacturing methods based on such idea:

1) Selective area growth (SAG) method. The EML devices manufactured by the famous corporations, such as NTT, Fujitsu, Nortel and Siemens, adopt the SAG method. This method grows multiple quantum well (MQW) active layers by one epitaxy (for example, Chinese Patent No. ZL00109780.6), and can get the bandgap wavelength difference between LD-MQW active layer and EAM-MQW active layer up to 30 meV. Although the SAG method greatly simplifies the growth process and reduces the cost, its brought problem is that the structure parameters of the LD-MQW active layer and those of the EAM-MQW active layer constrain each other, which is difficult to deal with in a single epitaxy. For example, in terms of reducing the threshold current and weakening the influence of non-uniform carrier implantation, the number of the QW in the LD active layer is required to be small and the thickness of the wells is required to be thin, but in terms of extinction ratio, the number of the QW in the EAM active layer is required to be large and the thickness of the wells is required to be thick. When the EML is actually manufactured by the SAG method, the numbers of the wells in the two active layers are equal, which is the tradeoff between the two sections, but it can not overcome the disadvantage that the thickness of the wells in the LD active layer is thick while the thickness of the wells in the EAM active layer is thin. Therefore, compared with the Butt-Joint method, the optical output power and the extinction ratio of the EML devices manufactured by the SAG method is inferior, and it's difficult to improve the characteristics of the devices.

2) Identical active layer (IAL) method, for example, U.S. Pat. No. 5,548,607. The manufacturing process of this method is simplest, because the active layer structures of the LD and the EAM are identical. The wavelength difference between LD section and EAM section is implemented by the red-shift of the oscillating wavelength determined by the Bragg gratings etched in the LD region relative to the peak wavelength of the QW active layer. However, the EAM section strongly absorbs the light from the LD region after all, so the threshold current of the device is high. It is difficult to improve the whole characteristics of EMLs by the IAL method.

3) QW intermixing (QWI) method, for example, IEEE Photonics Technology Letters, Vol. 7(9), P. 1016, 1995. On the basis of the IAL structure, this method makes intermixing of the MQW in the EAM section by ion implantation or dielectric induced diffusion plus annealing and so on to cause the blue-shift of the absorption peak wavelength of the MQW in this region, so as to reduce the absorption loss and improve the characteristics. However, till now, the repeatability of the intermixing technology hasn't be solved effectively.

4) Stacked-layer MQW structure, for example, IEEE Photonics Technology Letters, Vol. 14(12), P. 1647, 2002. This method grows the 2-stacked-layer MQW structure by one epitaxy, one layer EAM-MQW and another layer LD-MQW, and the two layers can be designed respectively so that the bandgap wavelength difference between them is no more than 60 nm. However, the EAM-MQW layer in the LD section not only absorbs the light from the LD-MQW, but also consumes the injection carrier, and the LD-MQW layer in the EAM section has relatively strong absorption of light when there is no bias voltage, so EML devices of stacked-layer MQW structure have high threshold current and low optical output power. In 2003, we proposed an improved stacked-layer MQW structure (Chinese patent application No. 200310122343.7), which improves the optical output power significantly by etching the LD-MQW layer in the EAM section away by photolithography and selective etching. However, the problem of high threshold current of these EMLs hasn't been solved yet.

SUMMARY OF THE INVENTION

An object of the present invention is to provide a method for manufacturing a selective area grown stacked-layer electro-absorption modulated laser structure, which can obviously improve the characteristics of EML integrated devices, has the advantages of low threshold current, high extinction ratio and high optical output power, and can grow a stacked-layer structure of an LD active layer and an EAM active layer only by one epitaxy, and the process is simple, which is suitable for large-scale mass production.

The method for manufacturing selective area grown stacked-layer electro-absorption modulated laser structure according to the present invention is characterized in comprising:

Step 1: forming a selective growth pattern of a modulator section on a substrate;

Step 2: simultaneously growing a 2-stacked-layer active region structure of a modulator MQW active layer and a laser MQW active layer by a first epitaxy step;

Step 3: etching gratings, and removing the laser MQW active layer in the modulator section by selective etching; and Step 4: completing the growth of the entire electro-absorption modulated laser structure by a second epitaxy step.

Preferably, a peak wavelength difference between the two layers of the 2-stacked-layer active region structure is no less than 110 nm, and a coupling peak wavelength difference between the laser and the modulator is no more than 60 nm.

Preferably, the selective growth pattern of the modulator section is two dielectric film stripes, which have a length of 100-300 μm and a width of 10-50 μm, and a opening width of the selective growth between the two dielectric stripes is 10-40 μm.

Preferably, the dielectric film is of $SiO_2$ or $Si_3N_4$, and the thickness thereof is 100-300 nm.

Preferably, a length of the modulator section is 100-300 μm, a length of the laser section is 200-600 μm, and a length of a transition region between the modulator section and the laser section is 30-100 μm, and the transition region is also of a length of an electrically isolating region between the modulator and the laser.

Preferably, the first epitaxy step includes a buffer layer, a lower separate-confinement heterostructure (SCH) layer, a modulator MQW layer, a thin InP etching stop layer, a laser MQW active layer and a upper SCH layer; and wherein a doping type of the buffer layer is the same as that of the substrate, while the other layers are involuntarily doped layers.

Preferably, the second epitaxy step includes an InP gratings cover layer, an InGaAsP etching stop layer, a thick InP cap layer and a low resistance InGaAs contact layer; wherein the doping type of the second epitaxy is opposite to that of the substrate.

Preferably, the number of the QW in the modulator layer is 6-15, and the number of the QW in the laser layer is 3-6.

Preferably, the number of the QW in the modulator is more than that in the laser, the thickness of the modulator is greater than that of the laser, the modulator MQW layers in the modulator section are thicker than that in the laser section, and are further thicker than the laser layer; in the horizontal direction, the laser layer faces the modulator MQW layers in the modulator section.

Preferably, a peak wavelength difference between the laser MQW layer and the modulator MQW layer in the laser section is no less than 110 nm, and a peak wavelength difference between the laser MQW layer in the laser section and the modulator MQW layer in the modulator section is no more than 60 nm.

Preferably, the upper SCH layer and the laser active layer in the modulator section are removed by selective etching solutions.

Preferably, the modulator MQW layer in the modulator section and the laser MQW layer in the laser section are grown by the same epitaxy.

The present invention makes full use of the features of the SAG technology and the improved stacked-layer technology, and not only remains the advantages of these two technologies, but also greatly weakens the disadvantages thereof, so it is possible for these two technologies to reinforce each other to realize excellent characteristics of devices which is impossible only by either of these two.

BRIEF DESCRIPTION OF THE DRAWINGS

In order to further illustrate the teachings of the present invention, the present invention is described in detail below in conjunction with the embodiments and the accompanying figures, in which.

DETAILED DESCRIPTION OF PREFERRED EMBODIMENTS

Figure 1:
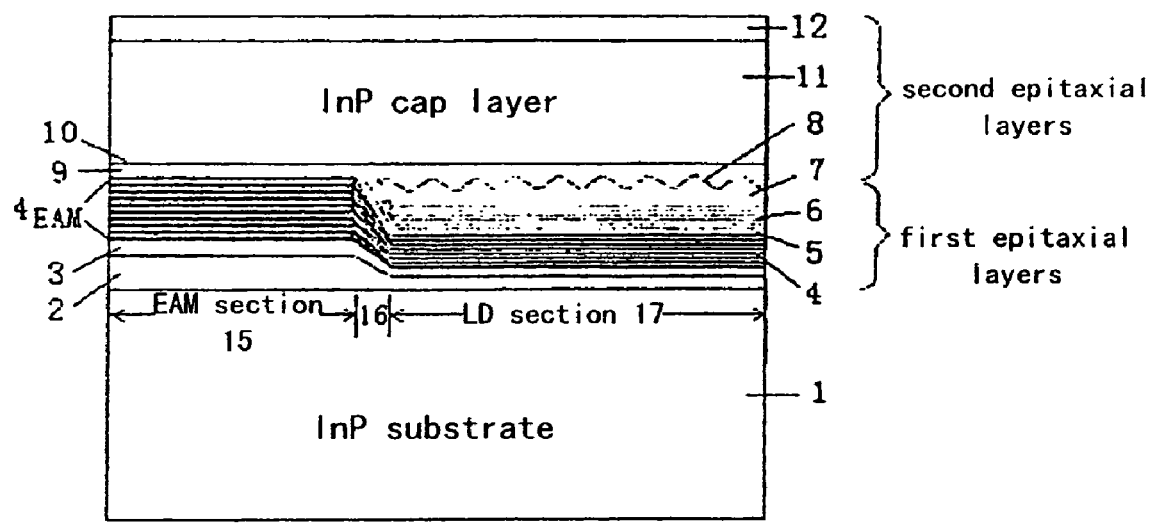
FIG. 1 shows a section view illustrating the SAG stacked-layer EML structure according to the embodiment of the present invention.
Figure 2:
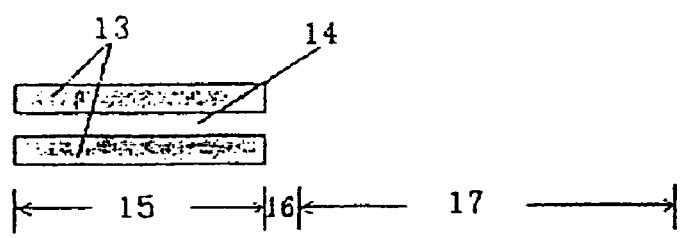
FIG. 2 shows the SAG mask pattern according to the present invention.

Referring to FIG. 1 and FIG. 2, a method for manufacturing a selective area grown stacked-layer electro-absorption modulated laser structure comprises following steps.

Step 1: a selective growth pattern of a modulator section 15 is formed on a substrate 1, wherein the selective growth pattern of the modulator 15 is two dielectric film stripes 13, which have a length of 100-300 μm and a width of 10-50 μm, an opening width 14 of the selective growth between the two dielectric stripes is 10-40 μm; wherein said dielectric film is of $SiO_2$ or $Si_3N_4$, and has a thickness of 100-300 nm; wherein a length of the modulator section 15 is 100-300 μm, a length of a laser section 17 is 200-600 μm, and a transition region 16 between the modulator section 15 and the laser section 17 has a length of 30-100 μm, and the transition region 16 is also of a length of the electrically isolating section between the modulator and the laser;

Step 2: a 2-stacked-layer active region structure of a modulator MQW layer and a laser MQW layer is grown by a first epitaxy step, wherein a peak wavelength difference between the two layers of the 2-stacked-layer active region structure is no less than 110 nm, and a coupling peak wavelength difference between the laser and the modulator is no more than 60 nm; wherein the first epitaxy includes a buffer layer 2, a lower SCH layer 3, a modulator MQW 4, a thin InP etching stop layer 5, a laser MQW active layer 6 and a upper SCH layer 7; the doping type of the buffer layer is the same as that of the substrate 1, and all the other layers are involuntarily doped layers; wherein the number of the QW of the modulator layer 4 is 6-15, and that of the laser layer 6 is 3-6; wherein the number of the QW of the modulator layer 4 is greater than that of the laser layer 6, the thickness of the modulator layer 4 is thicker than that of the laser layer 6, and the thickness of the modulator layer $4_{EAM}$ in the modulator section 15 is thicker than that of the modulator layer 4 in the laser section 17, and is further thicker than that of the laser layer 6; in the horizontal direction, the laser MQW layer 6 face the modulator MQW layers $4_{EAM}$ in the modulator section; the peak wavelength difference between the laser MQW layer 6 and the modulator MQW layer 4 is no less than 110 nm, and the wavelength difference between the laser MQW layer 6 and the modulator MQW layer $4_{EAM}$ in the modulator section is no more than 60 nm;

Step 3: gratings are etched, and the laser MQW layer in the modulator section is selectively etched away;

Step 4: the growth of the entire electro-absorption modulated laser structure is completed by a second epitaxy step, which includes an InP gratings cover layer 9, an InGaAsP etching stop layer 10, a thick InP cap layer 11 and a low resistance InGaAs contact layer 12; the doping type of the second epitaxy is opposite to that of the substrate 1.

Preferably, the upper SCH layer and the laser MQW layer in the modulator section 15 are removed by selective etching solutions.

Preferably, the modulator MQW layer $4_{EAM}$ in the modulator section 15 and the laser MQW layer 6 in the laser section 17 are formed by the same epitaxy.

That is, referring to FIG. 1, a layer of dielectric film is first grown on the upper surface of the InP substrate 1; the SAG mask pattern is etched on the dielectric film layer by normal photolithography (see FIG. 2), i.e. the dielectric mask region 13 is etched out in the EAM section 15; by using MOCVD epitaxial technique, the first epitaxy step is carried out on the substrate 1 with etched SAG mask pattern, that is, the buffer layer 2, the lower SCH layer 3, the EAM-MQW active layer 4, the thin InP etching stop layer 5, the LD-MQW active layer 6 and the upper SCH layer 7 are continuously grown; the DFB gratings 8 are formed in the upper SCH layer by holographic interference or electron beam exposure; the upper SCH layer and the LD-MQW layer in the EAM section 15 are etched away by normal photolithography and etching technology; the second epitaxy is carried out after the dielectric film stripes are removed, that is, the InP grating cover layer 9, the InGaAsP etching stop layer 10, the thick InP cap layer 11 and the heavily doped low resistance InGaAs contact layer 12 are continuously grown. thus the manufacturing of the novel SAG stacked-layer EML structure is completed (see FIG. 1). Thereafter, EML devices of good performance can be manufactured simply by the normal simple ridge waveguide (RW) technology.

Following are the obvious advantages of the present invention:

1. The whole EML growth structure can be completed only by two epitaxial steps, and thus is suitable for manufacturing high speed stripe EML devices by the simple structure of RW, and facilitates the reduction of the cost and large scale production.

2. The foregoing SAG method utilizes the selective area growth in the LD region, and the present invention significantly differs from the SAG method in that the selective area growth is in the EAM region; when EML integrated devices are manufactured by the foregoing SAG method, the number of the QW in the EAM layer and in the LD layer are identical, and the thickness of the EAM-MQW is thinner while the thickness of the LD-MQW is thicker; however, in the present invention, the number of the QW in the EAM-MQW layer 4 is large (6-15 wells) while in the LD-MQW layer 6 is small (3-6 wells), and the EAM-MQW layer 4 is thicker while the LD-MQW layer 6 is thinner; as can be seen from above, the present invention completely overcomes the main disadvantage of the SAG technology.

3. In the foregoing stacked-layer MQW structure and the improved stacked-layer MQW structure, the bandgap wavelength difference between the LD-MQW layer and the EAM-MQW layer is designed to be no more than 60 nm, otherwise the extinction ratio of the device will be greatly impacted, but this causes the EAM-MQW layer in the LD section not only to absorb the light from the LD-MQW layer, but also to consume much injection carrier in vicinity of the threshold. In the present invention, the bandgap wavelength difference between the LD-MQW layer 6 and the EAM-MQW layer 4 can be designed to be no less than 110 nm, thus the width of the energy band of the EAM-MQW layer is much larger than that of the LD-MQW layer (for example, $\Delta E > 56$ meV at a wavelength of 1550 nm), which is near to transparent for the light from LD layer, so the light absorption of the EAM-MQW layer 4 in the LD section 17 is significantly reduced; this transparent design also makes the working current in the LD section be first concentratively injected into the LD-MQW layer 6 which is in a lower exciting level, so the threshold current of the device is reduced effectively; in addition, since the EAM section 15 adopts the SAG technology, the bandgap wavelength difference between the modulator MQW layer $4_{EAM}$ in this section and the LD-MQW layer 6 in the LD layer 17 can still be designed to be no more than 60 nm, which keeps the device remaining the advantage of high extinction ratio; and by the appropriate design of the thickness of the InP buffer layer 2 at the bottom, the LD-MQW layer 6 in the LD section can face the modulator MQW layer $4_{EAM}$ in the EAM section, so the coupling loss between these two parts can be reduced, which further improves optical output power.

Figure 3:
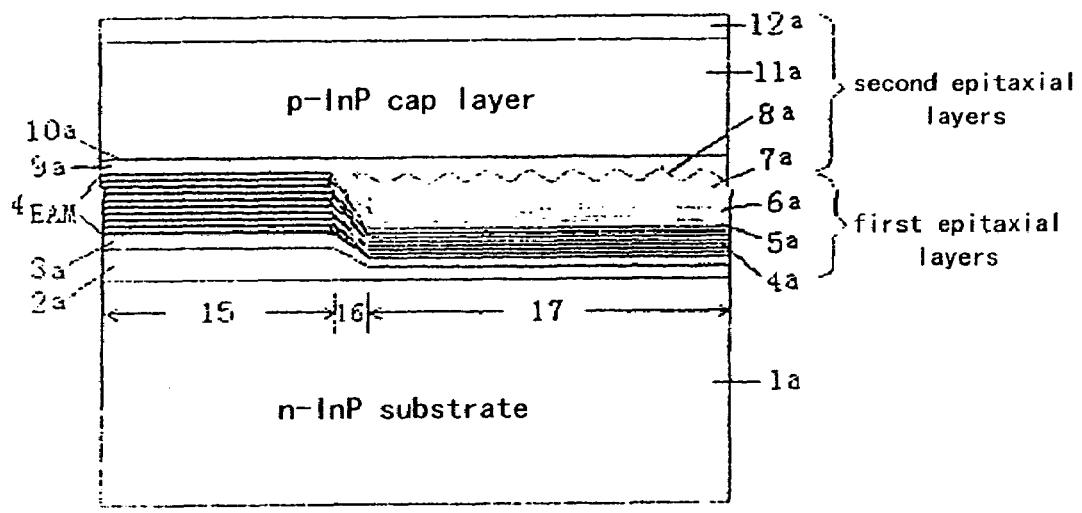
FIG. 3 shows a section view of an embodiment of the structure on the n-InP substrate according to the present invention.

FIG. 3 shows an instance of manufacturing the present invention on an n type InP substrate. First, a SiO$_2$ dielectric film of 100-300 nm thickness is grown on an n-InP substrate 1a; after the SAG mask pattern is etched, an n-InP buffer layer 2a of 300-500 nm thickness, a non-doped lower SCH layer 3a, an EAM-MQW active layer 4a, an InP etching stop layer 5a of 10-30 nm thickness, an LD-MQW active layer 6a and a non-doped upper SCH layer 7a are continuously epitaxially grown; then DFB gratings 8a are formed in the upper SCH layer by holographic interference method; the upper SCH layer and the LD-MQW layer in the EAM section are etched away by the selective etching solution H$_2$SO$_4$:H$_2$O$_2$:H$_2$O to reach the InP etching stop layer, and then the SiO$_2$ dielectric film stripes are removed by the HF buffer solution, and a p-InP grating cover layer 9a of 100-200 nm thickness, a p-InGaAsP etching stop layer 10a of 10-20 nm thickness, a p-InP cap layer 11a of 1.5-2 μm thickness and a heavily doped low resistance p-InGaAs contact layer 12a of 100-300 nm thickness are epitaxially grown, thus the manufacturing of the SAG stacked-layer EML structure on the n-InP substrate is completed.

Figure 4:
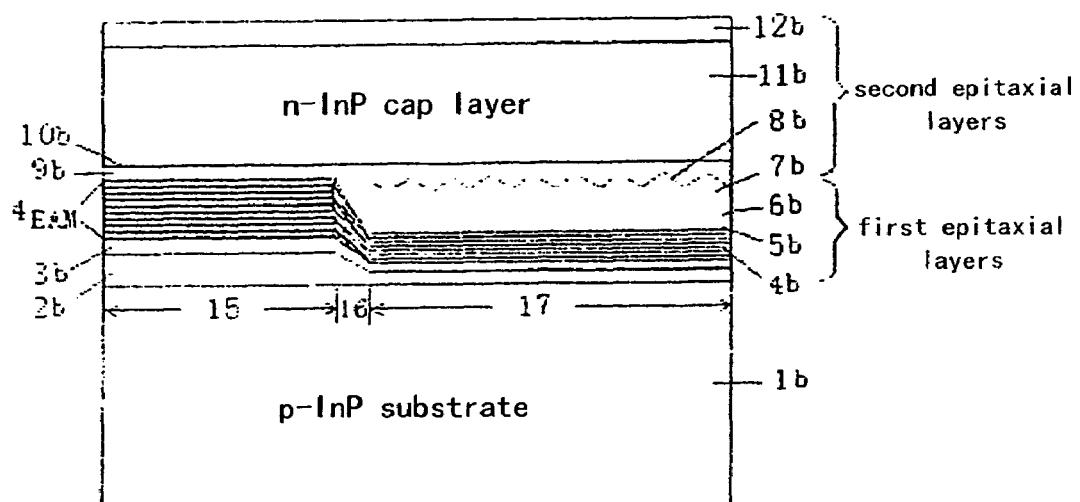
FIG. 4 shows a section view of an embodiment of the structure on the p-InP substrate according to the present invention

FIG. 4 shows an instance of manufacturing the present invention on a p type InP substrate. First, a SiO$_2$ dielectric film of 100-300 nm thickness is grown on a p-InP substrate 1b; after the SAG mask pattern is etched, a p-InP buffer layer 2b of 300-500 nm thickness, a non-doped lower SCH layer 3b, an EAM-MQW active layer 4b, an InP etching stop layer 5b of 10-30 nm thickness, an LD-MQW active layer 6b and a non-doped upper SCH layer 7b are continuously epitaxially grown; then DFB gratings 8b are formed in the upper SCH layer by the holographic interference method; the upper SCH layer and the LD-MQW layer in the EAM section are etched away by the selective etching solution H$_2$SO$_4$:H$_2$O$_2$:H$_2$O to reach the InP etching stop layer, and then the SiO$_2$ dielectric film stripes are removed by the HF buffer solution, and an n-InP grating cover layer 9b of 100-200 nm thickness, an n-InGaAsP etching stop layer 10b of 10-20 nm thickness, an n-InP cap layer 11b of 1.5-2 μm thickness and a heavily doped low resistance n-InGaAs contact layer 12b of 100-300 nm thickness are epitaxially grown, thus the manufacturing of the SAG stacked-layer EML structure on the p-InP substrate is completed.

What is claimed is:

1. A method for manufacturing selective area grown stacked-layer electro-absorption modulated laser structure, characterized in comprising:
   - step 1: forming a selective growth pattern of a modulator section on a substrate;
   - step 2: simultaneously growing a 2-stacked-layer active region structure of a modulator MQW layer and a laser MQW layer by a first epitaxy step;
   - step 3: etching gratings, and removing the laser MQW layer in the modulator section by selective etching; and
   - step 4: completing the growth of the entire electro-absorption modulated laser structure by a second epitaxy step.

2. The method according to claim 1, wherein a peak wavelength difference between the two layers of the 2-stacked-layer active region structure is no less than 110 nm, and a coupling peak wavelength difference between the laser and the modulator is no more than 60 nm.

3. The method according to claim 1, wherein the selective growth pattern of the modulator section is two dielectric film stripes, which have a length of 100-300 μm and a width of 10-50 μm, and a opening width of the selective growth between the two dielectric stripes is 10-40 μm.

4. The method according to claim 3, wherein the dielectric film is of $SiO_2$ or $Si_3N_4$, and the thickness thereof is 100-300 nm.

5. The method according to claim 1, wherein a length of the modulator section is 100-300 μm, a length of the laser section is 200-600 μm, and a length of a transition region between the modulator section and the laser section is 30-100 μm, and the transition region is also of a length of an electrically isolating region between the modulator and the laser.

6. The method according to claim 1, wherein the first epitaxy step includes a buffer layer, a lower SCH layer, a modulator MQW layer, a thin InP etching stop layer, a laser MQW active layer and a upper SCH layer; and wherein a doping type of the buffer layer is the same as that of the substrate, while the other layers are involuntarily doped layers.

7. The method according to claim 1, wherein the second epitaxy step includes an InP gratings cover layer, an InGaAsP etching stop layer, a thick InP cap layer and a low resistance InGaAs contact layer; and wherein a doping type of the second epitaxy is opposite to that of the substrate.

8. The method according to claim 1, wherein the number of the QW in the modulator MQW is 6-15, and the number of the QW in the laser layer is 3-6.

9. The method according to claim 1, wherein the number of the QW in the modulator MQW is greater than that in the laser layer, the thickness of the modulator MQW is greater than that of the laser layer, and modulator MQW layers in the modulator section are thicker than that in the laser section, and are further thicker than the laser MQW layer; in a horizontal direction, the laser MQW layer is faced the modulator MQW layers in the modulator section; a peak wavelength difference between the laser MQW layer and the modulator MQW layer in the laser section is no less than 110 nm, and a peak wavelength difference between the laser MQW layer in the laser section and the modulator MQW layer in the modulator section is no more than 60 nm.

10. The method according to claim 1, wherein the upper SCH layer and the laser MQW layer in the modulator section are removed by selective etching solutions.

11. The method according to claim 1, wherein the modulator MQW layer in the modulator section and the laser MQW layer in the laser section are grown by the same epitaxy.

* * * * *